(12) United States Patent
Kamgaing et al.

(10) Patent No.: US 10,992,017 B2
(45) Date of Patent: Apr. 27, 2021

(54) SEMICONDUCTOR PACKAGE COMPRISING CHIPLETS DISPOSED ON A SUBSTRATE WHICH ARE ELECTROMAGNETICALLY COUPLED BY DIELECTRIC WAVEGUIDES AND A COMPUTING NETWORKS FORMED THEREFROM

(71) Applicant: Intel Corporation, Santa Clara, CA (US)

(72) Inventors: Telesphor Kamgaing, Chandler, AZ (US); Georgios Dogiamis, Chandler, AZ (US); Aleksandar Aleksov, Chandler, AZ (US); Gilbert W. Dewey, Beaverton, OR (US); Hyung-Jin Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 16/192,293

(22) Filed: Nov. 15, 2018

(65) Prior Publication Data

US 2019/0089036 A1    Mar. 21, 2019

(51) Int. Cl.
*H01P 5/08* (2006.01)
*H01P 3/16* (2006.01)
*H01P 1/208* (2006.01)
*H01L 23/66* (2006.01)
*H01L 25/065* (2006.01)
(Continued)

(52) U.S. Cl.
CPC .............. *H01P 5/087* (2013.01); *H01L 23/66* (2013.01); *H01L 25/0652* (2013.01); *H01P 1/2088* (2013.01); *H01P 3/16* (2013.01);

*H01P 5/107* (2013.01); *H01L 24/13* (2013.01); *H01L 24/16* (2013.01); *H01L 2223/6627* (2013.01); *H01L 2223/6677* (2013.01); *H01L 2224/131* (2013.01); *H01L 2224/13025* (2013.01); *H01L 2224/13082* (2013.01); *H01L 2224/13147* (2013.01); *H01L 2224/16145* (2013.01); *H01L 2224/16146* (2013.01); *H01L 2224/16225* (2013.01); *H01L 2224/16227* (2013.01); *H01L 2224/17181* (2013.01); *H01L 2225/06513* (2013.01); *H01L 2225/06517* (2013.01); *H01L 2225/06537* (2013.01); *H01L 2924/1421* (2013.01); *H01L 2924/1431* (2013.01); *H01L 2924/1432* (2013.01); *H01L 2924/1434* (2013.01); *H01L 2924/1436* (2013.01); *H01L 2924/15311* (2013.01); *H01L 2924/3025* (2013.01)

(58) Field of Classification Search
CPC ............. H01P 5/107; H01P 5/087; H01P 3/16
USPC .......................................................... 333/26
See application file for complete search history.

(56) References Cited

U.S. PATENT DOCUMENTS 9,531,052 B2 * 12/2016 Dang et al. ............... H01P 5/02
2012/0013499 A1 * 1/2012 Hayata .................... G01S 7/032
342/112

(Continued)

*Primary Examiner* — Benny T Lee
(74) *Attorney, Agent, or Firm* — Patent Capital Group

(57) ABSTRACT

Embodiments may relate to a dielectric waveguide that includes a substrate and a waveguide material disposed within the substrate. The dielectric waveguide may further include a waveguide launcher electromagnetically and physically coupled with the waveguide material, wherein the waveguide launcher is exposed at a side of the dielectric substrate. Other embodiments may be described or claimed.

19 Claims, 8 Drawing Sheets

(51) Int. Cl.
    *H01P 5/107*     (2006.01)
    *H01L 23/00*     (2006.01)

(56) References Cited

U.S. PATENT DOCUMENTS

| | | | |
|---|---|---|---|
| 2015/0295298 A1* | 10/2015 | Payne et al. | H01P 3/16 343/837 |
| 2016/0064792 A1* | 3/2016 | Qiang et al. | G01S 13/02 342/175 |
| 2019/0013562 A1* | 1/2019 | Rusch et al. | G02B 6/4415 |

* cited by examiner

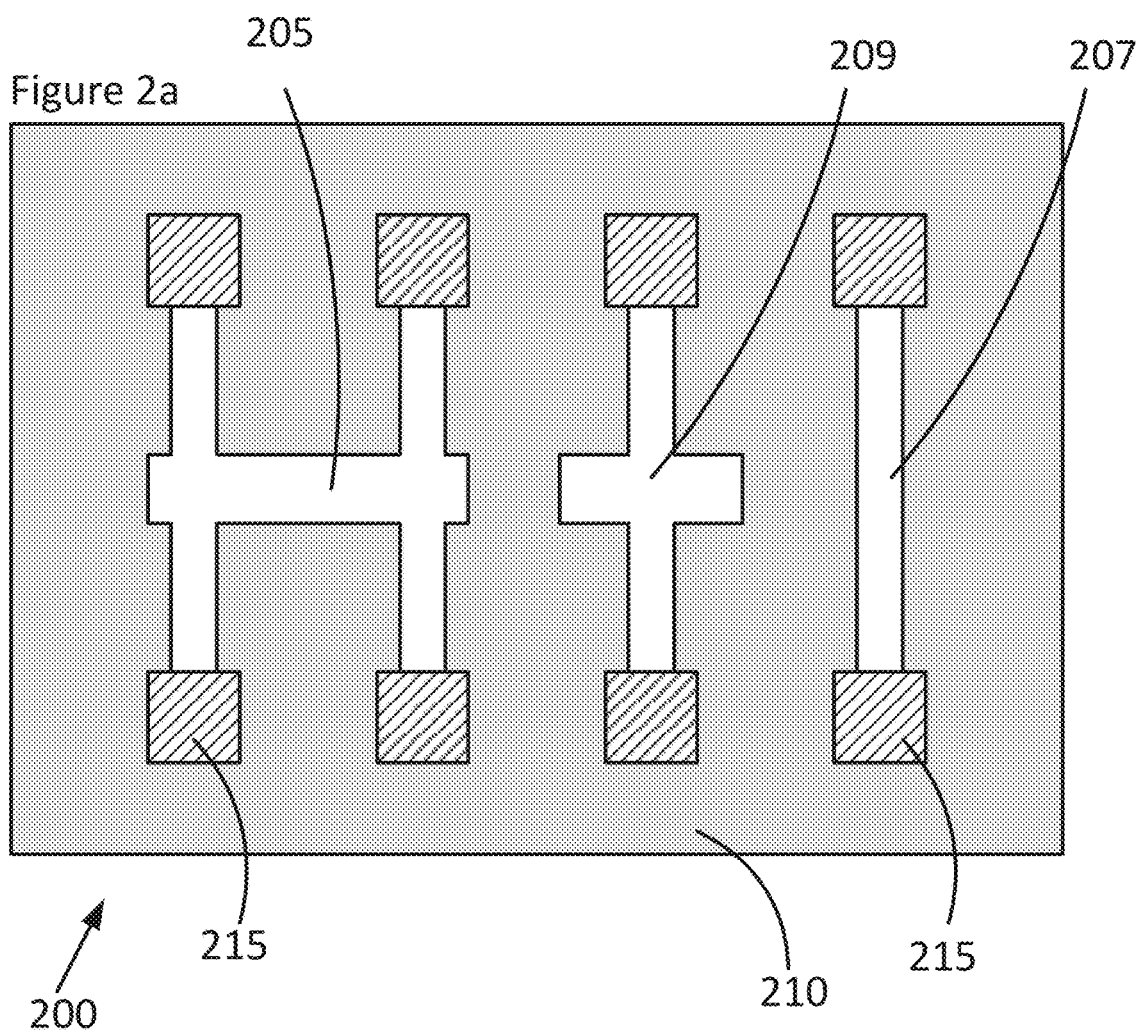
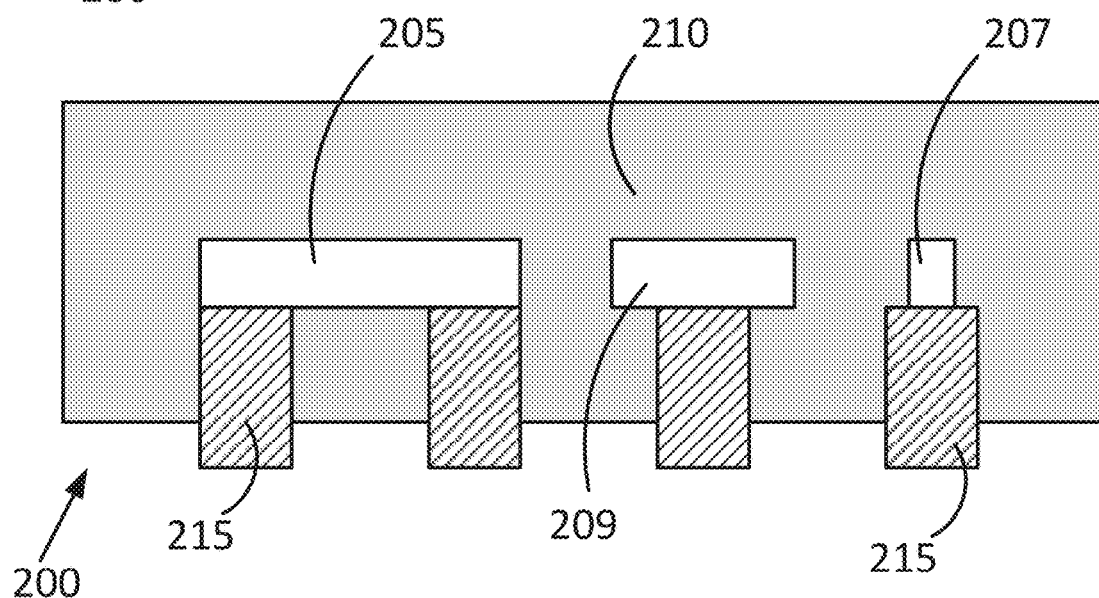
Figure 2a
Figure 2b

SEMICONDUCTOR PACKAGE COMPRISING CHIPLETS DISPOSED ON A SUBSTRATE WHICH ARE ELECTROMAGNETICALLY COUPLED BY DIELECTRIC WAVEGUIDES AND A COMPUTING NETWORKS FORMED THEREFROM

BACKGROUND

Future systems may require extremely high-speed links—e.g., on the order of several hundred gigahertz (GHz) to on the order of a terahertz (THz)—between circuit blocks of a die or between different dies of a computing system or semiconductor package. At such frequencies, metal losses may be relatively high.

BRIEF DESCRIPTION OF THE DRAWINGS

FIGS. 2a and 2b depict another example on-chip waveguide, in accordance with various embodiments.

DETAILED DESCRIPTION OF THE INVENTION

Figure 1A:
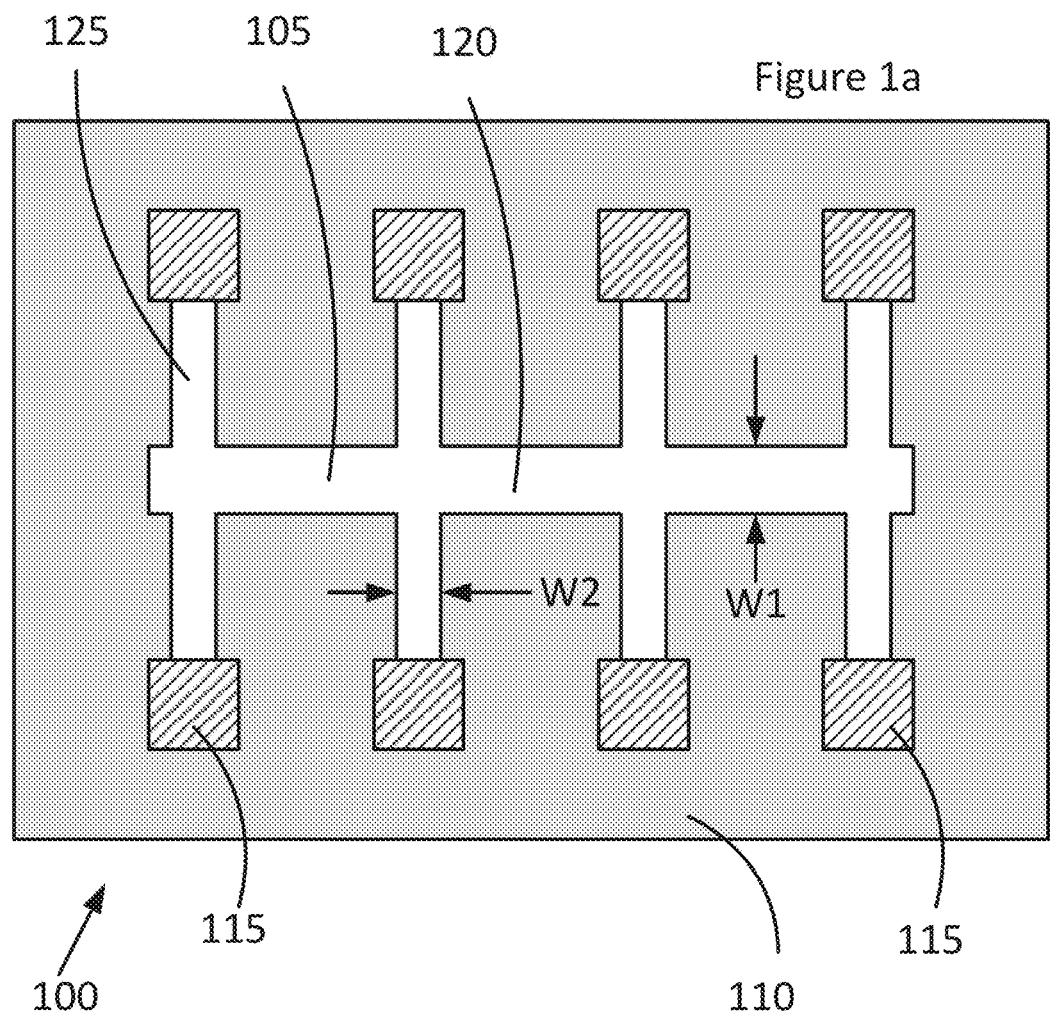
FIGS. 1a and 1b depict an example on-chip waveguide, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted above, high-speed links may be desirable for inter-chip or intra-chip communications in the THz range. Dielectric waveguides may be desirable for use in such systems. However, legacy waveguides may present at least two concerns. A first concern may be that thinness of the interlayer dielectric (ILD) material may present issues. For example, deposition of a sub-10 micrometer ("micron" or "μm") layer in a legacy silicon backend may result in both high losses and increased thickness variation. Additionally, it may be difficult to control thickness of organic build-up layers when thin waveguides are implemented in a typical multilayer organic package fabrication flow.

Embodiments herein may relate to a waveguide built in a rigid semiconductor substrate. The waveguide may be used to transfer high-speed data between chips or critical building blocks of a computing device. In some embodiments, the waveguide may be built as a separate substrate or as an interposer that is used as a part of a semiconductor package. As used herein, an "interposer" may refer to a component that allows communication between a first element coupled to the interposer using interconnects with a first pitch, and a second element coupled to the interposer using interconnects with a second pitch Embodiments herein may provide a number of advantages. One advantage may be that embodiments herein may have better process tolerance than legacy organic or low-temperature co-fired ceramic (LTCC) waveguides. Additionally, embodiments herein may have a thickness that may be useful for high-bandwidth or bandwidth-dense applications. Embodiments herein may also provide increased electrical performance or form factor reduction over legacy waveguides.

More generally, embodiments herein may relate to use of an on-chip waveguide network to establish high-speed communication (e.g., several hundred GHz to one THz or higher) links between circuit building blocks on either the same chip or on different chips. The waveguide network may be implemented on a semiconductor substrate or a low loss high resistivity substrate. Example substrates may include glass, silicon, Gallium Nitride, Gallium Arsenide, Aluminum Nitrite, etc. More generally, the choice of substrate used may be driven by factors such as that ability to sustain low process variations. The ability to sustain the low process variations may be desirable for operation in the frequency range of several hundred GHz to on the order of a THz or higher.

Figure 1B:
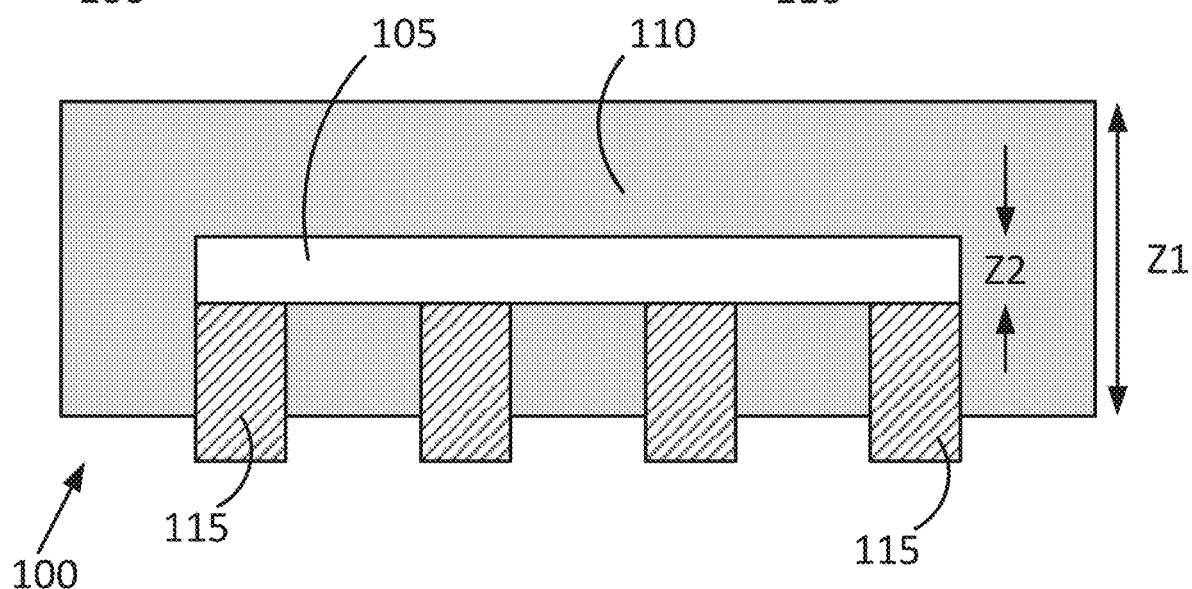

FIGS. 1a and 1b (collectively, "Figure F") depict an example on-chip waveguide network 100, in accordance with various embodiments. Specifically, FIG. 1a depicts a highly-simplified top-down view of the on-chip waveguide network 100, while FIG. 1b depicts a highly-simplified side-view of the on-chip waveguide network 100. FIG. 1a may generally be viewed as an illustrational cross-sectional view of FIG. 1b. FIG. 1b may generally be viewed as an illustrational cross-sectional view of FIG. 1a. The on-chip waveguide network 100 may include a substrate 110 with a waveguide material 105 positioned therein. The on-chip waveguide network 100 may also include one or more wave launchers 115 as depicted in FIG. 1. The waveguide material 105 may include a main section 120 (FIG. 1a), which may be generally viewed as the thicker portion of the waveguide material 105 that is generally directed laterally with respect to the orientation of FIG. 1a. The waveguide material 105 may additionally include a plurality of branches 125 (FIG. 1a) which may be viewed as the generally vertical portions of the waveguide material 105 with respect to the orientation of FIG. 1a. For example, eight branches 125 are depicted in FIG. 1a. Generally, the main section 120 and the branches 125 of the waveguide material may be a unitary piece of material, for example a piece of material formed at the same time, whereas in other embodiments the main section 120 and the branches 125 may be portions of material manufactured at different times and then physically coupled together at a later time.

As can be seen in FIG. 1b, the substrate 110 may have a z-height of Z1. In some embodiments, Z1 may be between approximately 50 micrometers and on the order of a few hundred microns. Additionally, the waveguide material 105 may have a z-height Z2. Z2 may generally be dependent on factors such as the material used for the waveguide material 105 or the substrate 110, the frequency of the electromagnetic wave that will be transmitted along the waveguide material 105, or other factors. For example, the z-height Z2 may be on the order of a few hundred microns if the electromagnetic wave has a frequency on the order of between approximately 100 and approximately 200 GHz. Alternatively, the z-height Z2 may be on the order of between approximately 10 and approximately 50 microns or higher if the electromagnetic wave has a frequency on the order of 1 THz. It will be understood that in some embodiments the main section 120 and the branches 125 of the waveguide material 105 may have a same z-height as one another, while in other embodiments one or more of the branches 125 may have a z-height that is different than another of the one or more branches 125 or the main section 120.

Similarly, as shown in FIG. 1a, the main section 120 may have a width W1 of between approximately 50 microns and approximately 300 microns, and the branches 125 may have a width W2 of between approximately 50 microns and approximately 300 microns. In some embodiments various of the branches 125 may have a same width as others of the branches 125, while in other embodiments one or more of the branches 125 may have a different width than another of the branches 125. Similarly to the z-height of the waveguide material 105, the various widths of the main section 120 or the branches 125 may be based on factors such as the predicted frequency of the electromagnetic wave that is to propagate through the main section 120 or the branches 125, the materials used, etc. Generally, the materials used for the waveguide material 105 may have a dielectric constant of between approximately 2 and approximately 10. A higher dielectric constant may generally allow for a smaller cross-sectional area of the main section 120 or the branches 125.

Generally, as noted above, the substrate 110 may include a variety of materials such as glass, silicon, or some other material. Additionally, as described in further detail below in FIG. 7, the substrate 110 may include an insulating or dielectric layer positioned on the glass or silicon material. The waveguide material 105 may include a variety of materials such as a low loss polymer, silicon dioxide ($SiO_2$), silicon nitride ($Si_3N_4$), aluminum nitride (AlN), ceramic filled polymer, or some other material. It may be desirable for the waveguide material 105 to have a loss tangent on the order of, or less than, approximately $2 \times 10^{-4}$, and in some embodiments the loss tangent may be less than approximately $0.5 \times 10^{-4}$. Generally, the waveguide material 105 may be a material that allows electromagnetic waves to propagate throughout the material.

In some embodiments, the waveguide material 105 may include a metal coating or cladding (not shown due to the simplified nature of the Figure) that surrounds the electromagnetically transparent portion of the waveguide material 105, however in other embodiments the metal coating/cladding may be absent. The metal coating or cladding may include copper, aluminum, gold, conductive epoxy, phase changing materials, etc. Generally, the cladding may be a dielectric material that has a different (e.g., lower) dielectric constant than the core material (e.g., the waveguide material 105). As such, the dielectric cladding may be ceramic, glass-based, or another polymer. For example, if the waveguide material 105 is a standard epoxy with a typical dielectric constant of between approximately 2.5 and approximately 3.5, then the cladding material may also be a porous version of an organic material such as polyvinylalcohol (PVA), Polyvinylidene fluoride (PVDF), some versions of Poly(methyl methacrylate) (PMMA), etc. Alternatively, inorganic cladding materials may include $SiO_2$, Si₃N₄, AlN, etc. if the inorganic cladding material has a lower dielectric constant than the material used for the waveguide material 105.

The spatial region in which the electromagnetic wave may propagate may be restricted by the substrate 110 or the metal coating/cladding. This restriction may be because the substrate 110 has a lower refractive index than the waveguide material 105, which may constrain the electromagnetic wave within the waveguide material 105. Alternatively, if the cladding includes metal, then the electromagnetic wave may be unable to penetrate through the cladding and therefore may be constrained within the waveguide material 105.

The wave launchers 115 may be constructs that are capable of transforming an electric signal to an electromagnetic wave or vice versa, similarly to how an antenna may perform for free space radiation/propagation. Although the wave launchers 115 are depicted in FIG. 1 as being a unitary piece of material, in other embodiments the wave launchers 115 may be composed of a one or more facing plates of a material such as copper, aluminum, alloys thereof, or some other material. In some embodiments the facing plates may have a dielectric material or some other material positioned between them.

As can be seen in FIG. 1b, the wave launchers 115 may at least partially extend from the substrate 110 at one end of the wave launcher 115 while they may further couple with the waveguide material 105 at the other end of the wave launcher 115. The extended portion of the wave launcher 115 may be configured to electrically couple with a die or some other component of a computing device that is configured to generate an electrical signal or provide an electrical signal to the wave launcher 115. The wave launcher 115 may then convert the electrical signal to an electromagnetic wave that is provided to the waveguide material 105. Conversely, the wave launcher 115 may be configured to receive an electromagnetic wave from the waveguide material 105, convert the electromagnetic wave to an electrical signal, and provide the electrical signal to a die or some other component to which the wave launcher 115 is coupled.

FIGS. 2a and 2b (collectively, "FIG. 2") depict another example on-chip waveguide network 200, in accordance with various embodiments. Similarly to FIG. 1a, FIG. 2a may be a highly-simplified cross-sectional top-down view of the on-chip waveguide network 200. Additionally, similarly to FIG. 1b, FIG. 2b may be a highly-simplified cross-sectional side-view of the on-chip waveguide network 200. The on-chip waveguide network 200 may include a substrate 210, a waveguide material 205, and one or more wave launchers 215, which may be respectively similar to substrate 110, waveguide material 105, and wave launchers 115. Additionally, the on-chip waveguide network 200 may include waveguide materials 207 and 209, which may be generally similar to waveguide material 105 (FIG. 1) or 205. As can be seen, waveguide material 207 may be considered to not have a main section such as main section 120 in FIG. 1. Rather, the waveguide material 207 may be considered to be a single branch (similar to branch 125 of FIG. 1) that couples two wave launchers 215. By contrast, waveguide material 209 may be considered to have a main section and two branches, but may still only electromagnetically couple two of the wave launchers 215.

Generally, FIG. 1 may be considered to depict a waveguide network that includes the waveguide material 105, and the waveguide network is coupled with eight wave launchers 115. Similarly, FIG. 2 may be consider to depict three waveguide networks that include the waveguide materials 205, 207, and 209; and one of the networks may be coupled with four wave launchers 215 while two others of the networks (e.g., the ones that includes waveguide materials 209 and 207) are coupled with two wave launchers 215. However, it will be understood that these numbers of elements, specifically the number of wave launchers 215, the number of connections or wave launchers 215 in each waveguide network, the numbers of branches, the existence of the main sections, the number or arrangement of waveguide networks, etc. is intended as one example of such a network. Other embodiments may have greater or fewer numbers of the various elements. Additionally, the relative lengths, widths, heights, etc. of the various elements may be different in different embodiments dependent on the specific use-cases of the on-chip waveguides, the design requirements of a system, the materials used, etc. as discussed above. For example, in some embodiments the main section 120 may be thinner than one or more of the branches 125 in one or more directions. Additionally, although various of the elements such as the waveguide materials or wave launchers are depicted as having one shape or cross-sectional area (e.g., square or rectangular), in other embodiments one or more of the elements may have a different shape such as rounded, triangular, etc.

Generally, it will be understood that although a signal may propagate through the overall waveguide network (e.g., throughout the waveguide material 105 of FIG. 1, 205, 207, or 209 of FIG. 2), switches and filtering techniques may be used to define different communication paths. For example, the main section 120 of the waveguide material 105 of FIG. 1 or a similar main section of FIG. 2 may be a broadband waveguide capable of conveying electromagnetic signals with a variety of signals, whereas the branches 125 of FIG. 1 or a similar branch of FIG. 2 may be designed to operate at different frequencies such that each branch only operates at a specific frequency or frequency range. Alternatively, both the main section and the branches may be broadband, but the dies coupled with the various wave launchers may have switches or filters to define their capability to transmit or receive information via the on-chip waveguides.

Figure 3:
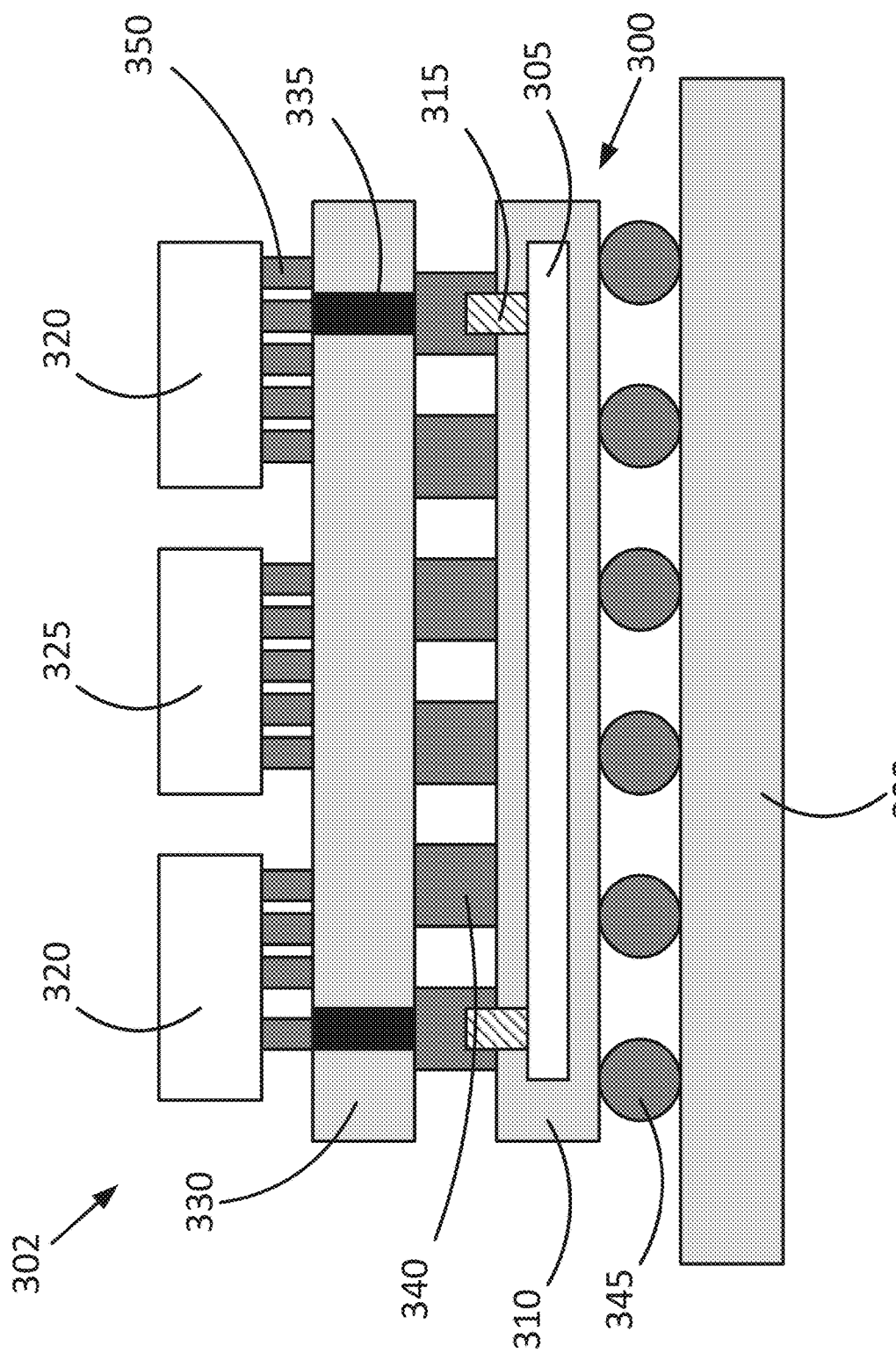
FIG. 3 depicts an example semiconductor package with an on-chip waveguide, in accordance with various embodiments.

FIGS. 3-6 depict different applications of on-chip waveguides such as on-chip waveguide networks 100 and 200 of FIGS. 1 and 2, respectively. Generally, the FIGS. 3-6 are intended as highly-simplified examples that may show various use-cases of the waveguides Specifically, FIG. 3 depicts the use case of a disaggregated die to illustrate the communication between high-speed nodes on a single die. As used herein, a "disaggregated die" may refer to a situation wherein several circuits that may have been implemented in a single die are implemented on a plurality of dies. In this situation, it may be desirable to use an inter-die network to re-establish communication between the various circuits. In the disaggregated die use case, the low frequency portion of the die may be relatively large. Because it is so large, connecting the various chiplets of the disaggregated die directly to one another may introduce a considerable amount of losses. High-speed communication (e.g., communication in the frequency range of several hundred GHz, a THz, or above) between the chiplets may therefore be introduced through use of an on-chip waveguide such as on-chip waveguides 100 and 200 of FIGS. 1 and 2, respectively, or some other on-chip waveguide as discussed herein.

Specifically, FIG. 3 depicts a semiconductor package 302. The semiconductor package 302 may include a plurality of chiplets 320 and 325. Generally, the chiplets may be chiplets of a disaggregated die such as a processing unit. That is, the processing unit (e.g. a central processing unit (CPU), a general processing unit (GPU), or some other processing unit) may be implemented as a plurality of chiplets that are physically separated from, but communicatively coupled to, one another. It will be understood that although the elements discussed herein may be referred to as chiplets of a disaggregated die, in other embodiments the elements may be different chips (e.g., a processing unit and a memory, or some other type of component) of a semiconductor package or a computing device.

The semiconductor package 302 may further include a base die 330. In some embodiments, the base die 330 may have additional elements either positioned within the base die (e.g., a processor or some other component that may allow the base die 330 to perform one or more logical computations, a memory, etc.) or coupled with the base die 330. These various elements are not depicted in FIG. 3 for the sake of lack of un-necessary clutter of the Figure. In some embodiments, the base die 330 may be referred to as an "interposer." Additionally, the base die 330 may further include a plurality of elements such as vias or traces that are conductive elements that allow signals to propagate throughout the base die 330, either vertically, laterally, or in some other direction. The vias or traces may be, for example, a conductive material such as copper, gold, etc. One such via is via 335, which may allow communication from one side of the base die 330 to the other. The vias 335 may be, for example, plated vias or some other type of via. It will be understood, however, that although the vias 335 are depicted as a single via, in other embodiments the vias 335 may be a plurality of vias between different layers of the base die 330. In these embodiments, one or more of the vias may be coupled with another of the vias by one or more traces.

The chiplets 320/325 may be coupled with the base die 330 by one or more interconnects 350. The interconnects 350 may be, for example, metal-to-metal bonds, copper pillars with very small amounts of solder, or some other type of interconnect that may allow physical coupling and electrical communication between the chiplets 320/325 and the base die 330.

The base die 330 may be coupled with an on-chip waveguide 300, which may be similar to on-chip waveguide networks 100 and 200 of FIGS. 1 and 2, respectively. The on-chip waveguide 300 may have a substrate 310, a waveguide material 305, and wave launchers 315 which may be similar to substrates 110/210, waveguide materials 105/205/207/209, and wave launchers 115 and 215 of FIGS. 1 and 2, respectively. Generally, the base die 330 may be coupled with the on-chip waveguide 300 by one or more interconnects 340. Similarly to the interconnects 350, the interconnects 340 may be metal-to-metal bonds, copper pillars with very small amounts of solder, or some other type of interconnect that may allow physical coupling and electrical communication between the base die 330 and the on-chip waveguide 300.

As can be seen in FIG. 3, the wave launchers 315 may be communicatively coupled with the interconnects 340, which in turn may be communicatively coupled with the vias 335 of the base die 330. The vias 335 may be communicatively coupled with one or more of the interconnects 350, which in turn may be communicatively and physically coupled with the chiplets 320. In this manner, the chiplets 320 may be communicatively coupled with one another by the interconnects 350, the vias 335, the interconnects 340, and the on-chip waveguide 300. Additionally, use of the on-chip waveguide 300 may allow communication between the chiplets 320 in the high-frequency range discussed above such as on the order of several hundred GHz, a THz, or above.

The semiconductor package 302 may be coupled with a base die 323 by one or more interconnects 345, which may be similar to the first or interconnects 340 or 350 discussed above. Alternatively, in some embodiments the interconnects 345 may be one or more solder bumps, a solder ball of a ball grid array (BGA), pins of a pin grid array (PGA), elements of a land grid array (LGA), or some other type of interconnect. The base die 323 may be a substrate similar to that described above with respect to base die 330. In some embodiments, the base die 323 may be a printed circuit board (PCB), an interposer, or some other type of substrate which may be used in a computing device.

Additionally, although not depicted in FIG. 3 for the sake of clarity of the Figure, in embodiments the on-chip waveguide 300 may include one or more vias, which may be similar to vias 335. Specifically, the vias may be positioned in the substrate 310 of the on-chip waveguide 300. Additionally or alternatively, the on-chip waveguide 300, and particularly the substrate 310, may include one or more traces, logic components, or other elements that may be found in a semiconductor die or package. The additional vias or traces may enable electrical (i.e., non-optical) communication within the on-chip waveguide 300, or between elements that are coupled with the on-chip waveguide 300. For example, the one or more vias or traces may enable communication between the interconnects 340 and the interconnects 345. In this manner, the chiplets 320/325 may be communicatively coupled with the base die 323.

Figure 4:
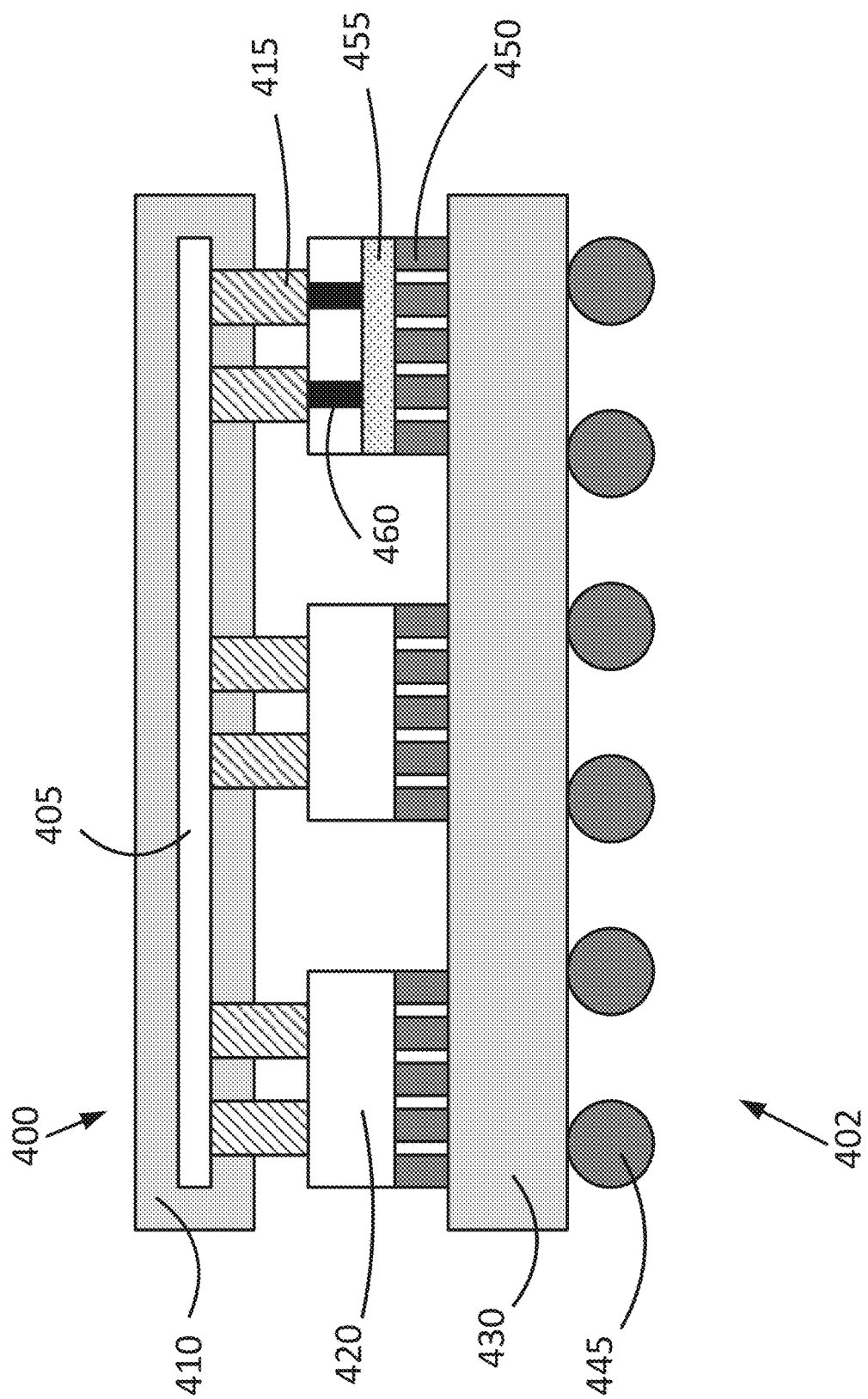
FIG. 4 depicts an alternative example semiconductor package with an on-chip waveguide, in accordance with various embodiments.

FIG. 4 depicts an alternative semiconductor package 402 integration scheme for an on-chip waveguide. The on-chip waveguide may be placed on the back-side of active dies. Wave launchers may be used to couple the high-speed signals in and out of the waveguide network. The waveguide substrate may also be designed to enable heat-spreading or electromagnetic shielding capabilities.

Specifically, FIG. 4 depicts a semiconductor package 402, which may have elements similar to those of FIG. 3. Specifically, the semiconductor package 402 may include an on-chip waveguide 400, which may generally be similar to on-chip waveguide networks 100, 200, and 300 in FIGS. 1, 2, and 3, respectively. Specifically, the on-chip waveguide 400 may include a substrate 410, a waveguide material 405, and one or more wave launchers 415, which may be respectively similar to wave launchers 115 and 215 of FIGS. 1 and 2, respectively.

The semiconductor package 402 may include a plurality of chiplets 420 coupled with the wave launchers 415. Specifically, the chiplets 420 may be separate dies (e.g., a memory die, a processing die, etc.) or they may be chiplets of a single disaggregated die as discussed above with respect to chiplets 320 and 325 of FIG. 3. The chiplets 420 may include a "front-side" 455. The front-side of the chiplet 420 may be the portion of the chiplet 420 wherein communication or logic components are located. The portion of the chiplet 420 that is coupled with the wave launcher 415 may be considered to be the "back-side" of the die. The chiplets 420 may include one or more through substrate vias 460, which may be similar to vias 335 discussed above with respect to FIG. 3, which communicatively couple the front-side of the chiplet 420 with the wave launchers 415.

The front-side of the chiplet 420 may be coupled with a substrate 430 by one or more first-level interconnects 450, which may be similar to interconnects 350. The substrate 430 may in some embodiments be considered to be a base die similar to base die 330. Specifically, the substrate 430 may be formed of similar materials, and include similar components, as those described above with respect to base die 330. The substrate 430 may include or be coupled with one or more interconnects 445, which may be similar to interconnects 345 of FIG. 3. Specifically, the interconnects 445 may be metal-to-metal bonds, copper pillars with very small amounts of solder, solder bumps, solder balls, elements of a BGA/PGA/LGA, etc. The interconnects 445 may allow both physical and communicative coupling of the package 402 with an element of a computing device such as a PCB or some other substrate.

As previously noted, in addition to allowing communicative coupling between the chiplets 420, the on-chip waveguide 400 may additionally serve the function of heat-spreading or electromagnetic shielding. Specifically, the on-chip waveguide 400 may be thermally coupled with the chiplets 420, and may couple with a vapor chamber or some other heat solution to help cool the chiplets. Additionally or alternatively, the on-chip waveguide 400 may include or be coupled with a material which may provide electromagnetic shielding to the chiplets 420.

Figure 5:
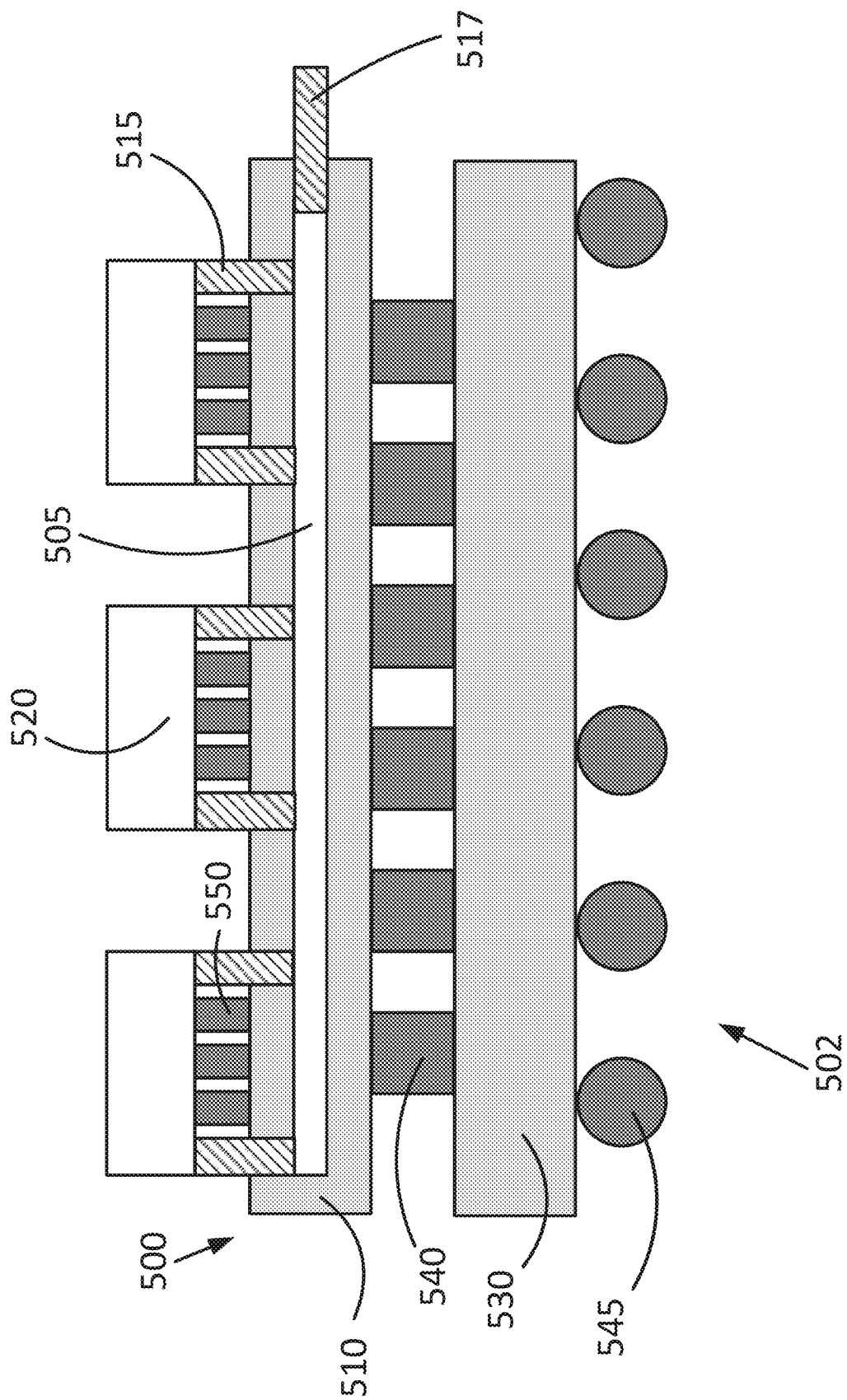
FIG. 5 depicts an alternative example semiconductor package with an on-chip waveguide, in accordance with various embodiments.

FIG. 5 depicts an alternative semiconductor package 502 wherein the on-chip waveguide may be used as an interposer. Specifically, the semiconductor package 502 may include a plurality of chiplets 520, which may be similar to chiplets 320 and 325, and chiplet 420, of FIGS. 3 and 4, respectively. The semiconductor package 502 may further include an on-chip waveguide 500, which may be similar to on-chip waveguides 100, 200, 300, and 400, of FIGS. 1, 2, 3, and 4, respectively. The one-chip waveguide 500 may include a substrate 510, a waveguide material 505, and one or more wave launchers 515, which may be respectively similar to substrates 110/210, waveguide material 105/205/207/209, and wave launchers 115 and 215 of FIGS. 1 and 2, respectively. The on-chip waveguide 500 may be coupled with a substrate 530, which may be similar to substrate 430 of FIG. 4. In some embodiments, the substrate 530 may be considered to be a base die, similar to base die 330 of FIG. 3. The on-chip waveguide 500 may be coupled with the substrate 530 by one or more interconnects 540, which may be similar to interconnects 350 of FIG. 3. The substrate 530 may further be coupled with or include interconnects 545, which may be similar to interconnects 445.

As can be seen in FIG. 5, the chiplets 520 may be coupled with the on-chip waveguide 500 in two ways. First, the chiplets 520 may be coupled with the on-chip waveguide 500 by interconnects 550, which may be similar to interconnects 350 of FIG. 3. Secondly, the chiplets 520 may be coupled with the on-chip waveguide 500 by the wave launchers 515. The on-chip waveguide 500, and particularly the substrate 510 of the on-chip waveguide 500, may include one or more traces, vias, or other logic components such as a processor or a memory as described above with respect to on-chip waveguide 300. These additional traces/vias/components/etc. may allow communication between the interconnects and the interconnects 550. As a result, the chiplets 520 may be communicatively coupled with the substrate 530, or using the interconnects 545, with a component to which the substrate 530 is coupled. As an example, a signal path from or to the chiplet 520 may include transmittance of a signal through the interconnects 550, through the traces/vias of the substrate 510, through the interconnects 540, through the traces/vias of substrate 530, and through the interconnects 545.

Additionally, as shown in FIG. 5, a wave launcher 517 may extend from the substrate 510. The wave launcher 517 may be used to communicatively coupled the on-chip waveguide 500 with one or more other elements of the computing device. For example, the wave launcher 517 may allow the on-chip waveguide 500, or the chiplets 520, to communicate with another processor, memory, or some other element to which the wave launcher 517 is communicatively coupled. This communication may occur at the relatively high-bandwidth discussed herein such as on the order of several hundred GHz, a THz, or above.

Figure 6:
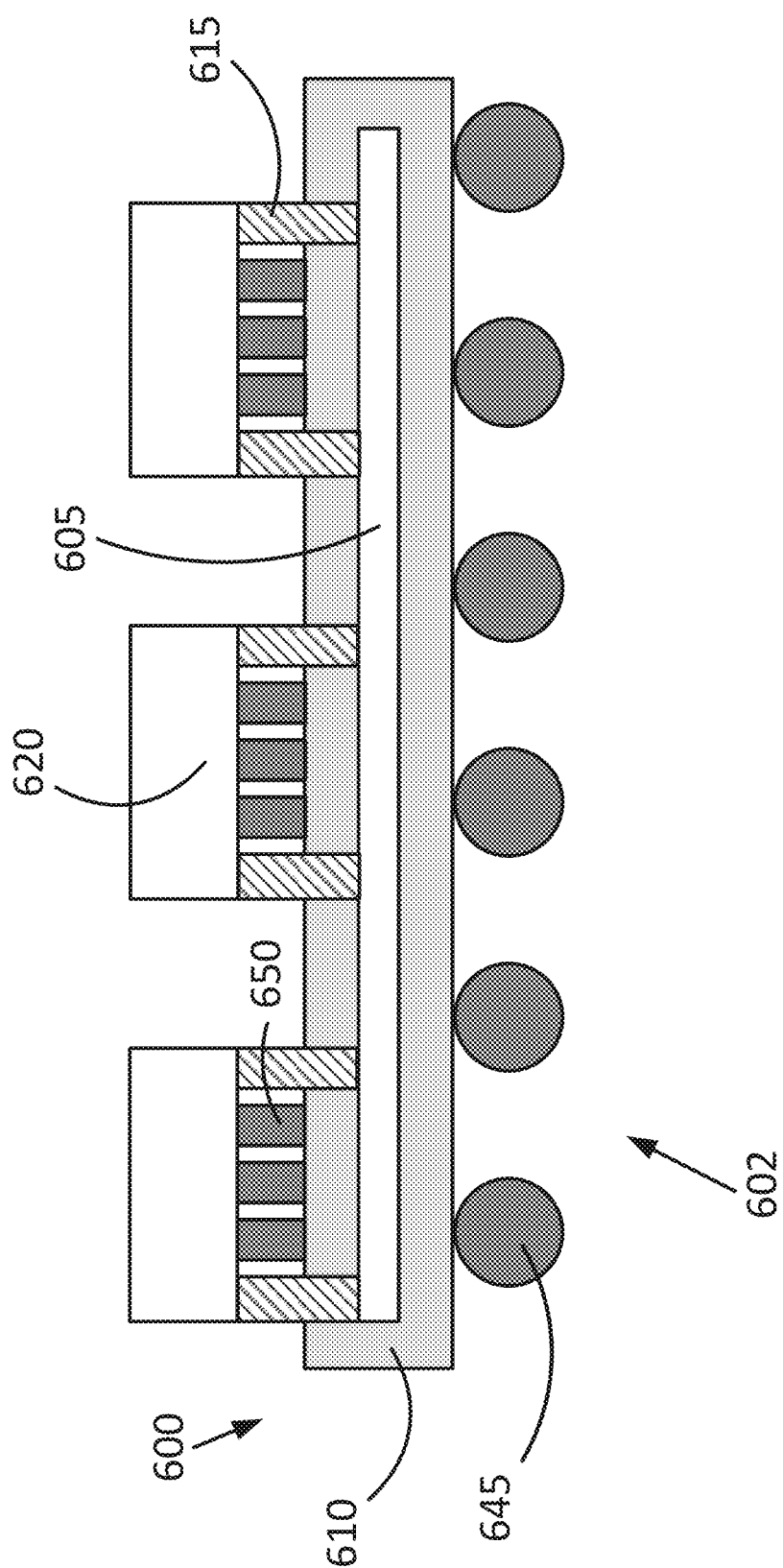
FIG. 6 depicts an alternative example semiconductor package with an on-chip waveguide, in accordance with various embodiments.

FIG. 6 depicts an alternative semiconductor package 602 wherein the waveguide network (i.e., the on-chip waveguide 600) may be implemented as, or as an element of, the package substrate. Specifically, the semiconductor package 602 may include a plurality of chiplets, which may be similar to chiplets 320/325 of FIG. 3, or some other chiplet discussed herein. The semiconductor package 602 may further include an on-chip waveguide 600, which may be similar to on-chip waveguide networks 100 and 200 of FIGS. 1 and 2, respectively, or some other on-chip waveguide discussed herein. Specifically, the on-chip waveguide 600 may include a substrate 610, a waveguide material 605, and one or more wave launchers 615, which may be respectively similar to substrate 110/210, waveguide material 105/205/207/209, and wave launchers 115 and 215 of FIGS. 1 and 2, respectively. Similarly to chiplets 520 of FIG. 5, the chiplets 620 may be coupled with the on-chip waveguide 600 both by coupling to the wave launchers 615, as well as interconnects 650 (which may be similar to interconnects 550 of FIG. 5).

Rather than, for example, the semiconductor package 502 of FIG. 5 wherein the on-chip waveguide 500 was communicatively coupled to interconnects 545 by interconnects 540 and substrate 530, the on-chip waveguide 600 itself may be coupled with the interconnects 645. In this embodiment, the substrate 610 may include one or more layers of glass or silicon or some other material as described above with respect to substrate 110 of FIG. 1. These layers may generally surround the waveguide material 605. The substrate 630 may further include one or more layers of an organic dielectric material or some other type of dielectric material that may commonly be used in a substrate such as substrate 530 of FIG. 5. Additionally, similarly to as described above with respect to substrate 530 of FIG. 5, the substrate 630 may include one or more vias, traces, or some other logic component. In this manner, the chiplets 620 may have a shorter communication path to whichever element or board of a computing device the interconnects 645 are coupled to. Additionally, the overall z-height of the semiconductor package 602 may be reduced as compared to other embodiments herein.

It will be understood that the above illustrated embodiments of FIGS. 1-6 are intended as examples of various use-cases, and other embodiments may have alterations to, or combinations of, one or more aspects of the various illustrated embodiments. For example, the wave launcher 517 of FIG. 5 may be present in one or more of the embodiments of FIG. 1-4 or 6. Additionally, although a number of elements (e.g., three chiplets 520 coupled to the on-chip waveguide 500 using three interconnects 550 each in FIG. 5), other embodiments may have different numbers of elements. For example, some embodiments may have more or fewer chiplets, interconnects, wave launchers, vias, etc. than are depicted in FIGS. 1-6. Additionally, the depicted relative sizes of the various elements (e.g., the height or pitch of one of the interconnects as opposed to another interconnect, the relative height of a chiplet as compared to a substrate, etc.) may be different in different embodiments. Generally, and unless stated to the contrary herein, the heights and spacings of the various elements are depicted herein for the purpose of an illustrative example, rather than a specific depiction of one or more dimensions or pitches of the various elements.

Figure 7:
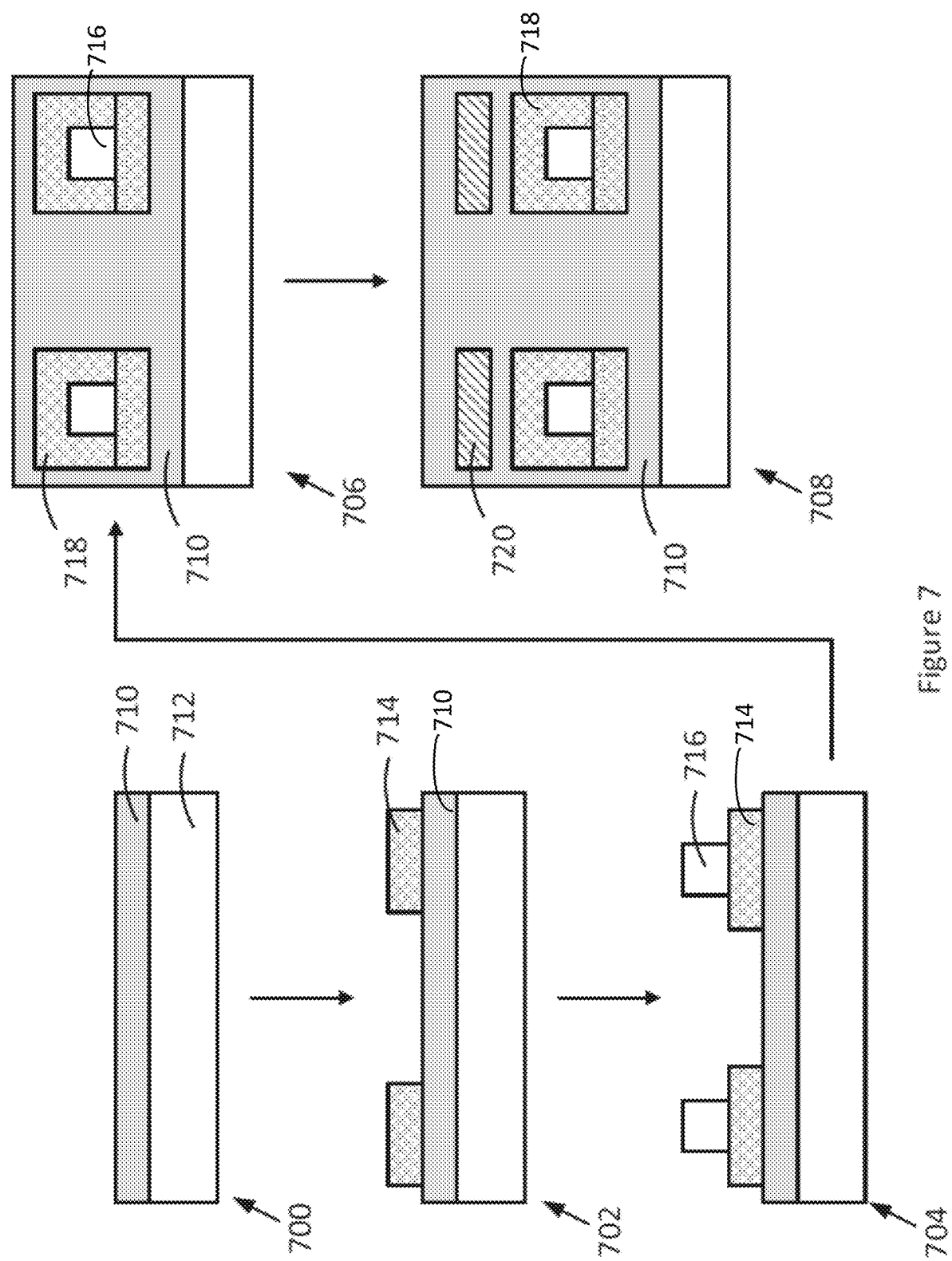
FIG. 7 depicts an example technique for manufacturing an on-chip waveguide, in accordance with various embodiments.

FIG. 7 depicts an example technique for manufacturing an on-chip waveguide, in accordance with various embodiments. Specifically, FIG. 7 may depict layers of detail that may not be present in the simplified depictions of FIGS. 1-6. In general, FIG. 7 may relate to a technique for manufacturing a plurality of on-chip waveguides at a time. Specifically, FIG. 7 depicts a technique wherein two on-chip waveguides may be manufactured in a single process. Generally, for the sake of clarity of the Figure, previously introduced elements may not be renumbered in subsequent portions of the technique.

Initially, at 700, dielectric material 710 may be deposited on a substrate 712. The substrate 712 may be similar to substrates 110/210/310/410/510/610 in FIGS. 1-6, respectively. For example, the substrate may be glass, silicon or some other material. The dielectric material 710 may be, for example silicon dioxide, laminated polymer film, etc. Generally, the dielectric material 710 may be to provide electrical insulation between the semiconducting silicon substrate and the metallization. It may also serve as foundation for the deposition of the seed layer needed for the metal coating. Generally, the substrate 712 and the dielectric material 710 may be simplified to the substrates 110/210/310/410/etc. of FIGS. 1-4, respectively.

Next, a metal layer 714 may be deposited on the dielectric material 710 at 702. As noted above with respect to FIG. 1, the metal layer 714 may be copper, aluminum, gold, etc. The metal layer 714 may be deposited on the dielectric material 710 through lamination, spray deposition, mechanical placement, or some other deposition technique.

The waveguide material 716 may then be deposited or formed on the metal layer 714 at 704. The waveguide material 716 may be, for example, similar to waveguide materials 105/205/305/405/505/606/etc. of FIG. 1-6, respectively. The waveguide material 716 may be deposited on the metal layer 714 through lamination, spray deposition, mechanical placement, or some other deposition technique.

A further metal layer 718 may be positioned on metal layer 714, generally surrounding the waveguide material 716, and the dielectric material 710 may be extended to generally cover the metal layer 718 at 706. The extension of the dielectric material 710 may be formed of the same dielectric material as dielectric material 710, or it may be formed of a different dielectric material such as one or more of the materials described above with respect to dielectric material 710. Similarly, the metal layer 718 may be formed of the same material as metal layer 714 in some embodiments, whereas in other embodiment the metal layer 718 may be formed of a different material than metal layer 714.

At 708, a metal plate 720 may be positioned above the metal layer 718 and the dielectric material 710 may be further extended to at least partially surround the metal plate 720. Similarly to at 706, the extension of the dielectric material 710 at 708 may be formed of the same dielectric material as dielectric material 710, or of a different dielectric material. Additionally, as discussed above with respect to wave launcher 115 of FIG. 1, a wave launcher may generally be formed of at least two opposing metal plates. The metal plate 720 at 708 may be one of the metal plates that may make up a portion of a wave launcher such as wave launchers 115/215/315/415/515/615/etc. of FIGS. 1-6, respectively. Subsequent to element 708, the structure may be singulated to form two on-chip waveguides which may be similar, for example, to on-chip waveguides 100/200/300/400/500/600/etc. of FIGS. 1-6, respectively.

Similarly to FIGS. 1-6, as discussed above, it will be understood that FIG. 7 is intended to be an example depiction of one technique for generating an on-chip waveguide. Specific heights/widths/etc., or the specific number of elements (e.g., the generation of only two on-chip waveguides) may be different in different embodiments. Additionally, in some embodiments the cladding depicted as metal layers 714 and 718 may not be present. Rather, the waveguide material 716 may be formed on, and in direct contact with, the dielectric material 710 on one or more sides of the waveguide material 716. In some embodiments, the metal plate 720 may be on the same layer as metal layer 718 (rather than, e.g., positioned above it as depicted in FIG. 7). Alternatively, some wave launchers may include one or more pillars inside of waveguide material 716 (in addition to, or instead of, metal plate 720). These pillars may be referred to as "probe launchers." Other variations may be present in other real-world embodiments.

Figure 8:
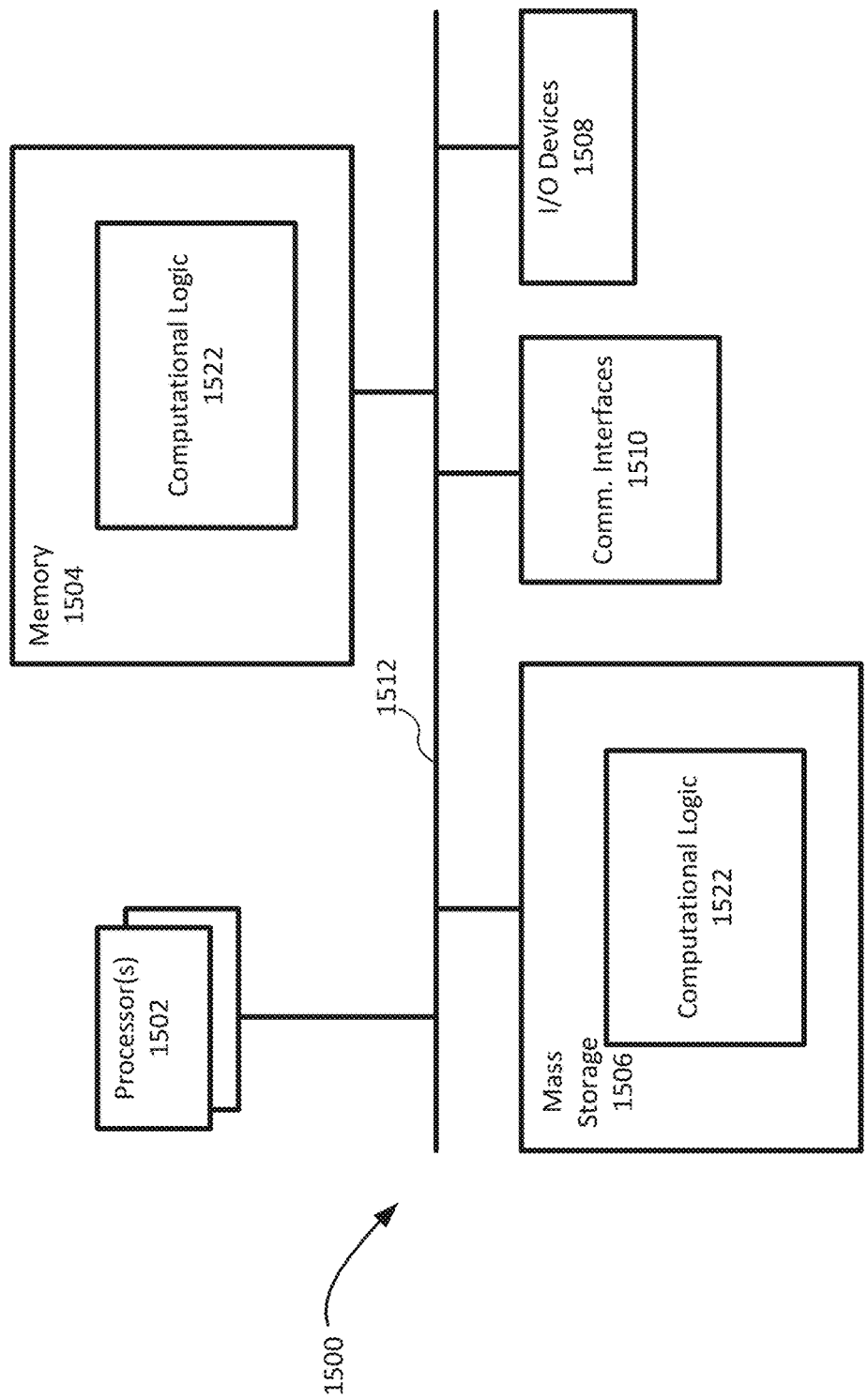
FIG. 8 depicts an example device that may use various embodiments herein, in accordance with various embodiments.

FIG. 8 illustrates an example computing device 1500 suitable for use with on-chip waveguide networks 100 and 200 of FIGS. 1 and 2, respectively, semiconductor packages 302, 402, 502, and 602 of FIGS. 3-6, respectively (collectively the "waveguide elements 100-600"), or some other element herein, in accordance with various embodiments. Specifically, in some embodiments, the computing device 1500 may include one or more of the waveguide elements 100-600 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic RAM (DRAM), compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces (comm. interfaces) 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as third generation (3G), fourth generation (4G), fifth generation (5G), and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile personal computer (PC), a mobile phone, or a digital camera. In further implementations, the computing device 1500 may be any other electronic device that processes data.

In some embodiments, as noted above, computing device 1500 may include one or more of the waveguide elements 100-600 therein. For example, in some embodiments the processor 1502, memory 1504, or some other component of the computing device 1500 may be communicatively coupled with another of the components of the computing device by the on-chip waveguides depicted in waveguide elements 100-600. For example, in some embodiments the processor cores 1502 may be similar to, for example, one or more of the chiplets 320/325/420/520/620, etc. depicted in FIGS. 3-6, respectively, herein, and may be similar coupled to one or more of the depicted on-chip waveguides.

EXAMPLES OF VARIOUS EMBODIMENTS

Example 1 includes a dielectric waveguide comprising: a substrate; a waveguide material disposed within the substrate; and a waveguide launcher electromagnetically and physically coupled with the waveguide material, wherein the waveguide launcher is exposed at a side of the dielectric substrate.

Example 2 includes the dielectric waveguide of example 1, wherein the waveguide material includes polymer or silicon dioxide ($SiO_2$).

Example 3 includes the dielectric waveguide of example 1, wherein the substrate is glass or silicon.

Example 4 includes the dielectric waveguide of example 3, wherein the substrate further includes a dielectric material.

Example 5 includes the dielectric waveguide of any of examples 1-4, wherein the waveguide launcher is a first waveguide launcher, and further comprising a second waveguide launcher electromagnetically and physically coupled with the waveguide material, wherein the second waveguide launcher is exposed at the side of the dielectric substrate.

Example 6 includes the dielectric waveguide of example 5, wherein the waveguide material is to allow electromagnetic waves to propagate from the first waveguide launcher to the second waveguide launcher.

Example 7 includes the dielectric waveguide of example 6, wherein the electromagnetic waves have a frequency of at least one terahertz (THz).

Example 8 includes a semiconductor package that includes a dielectric waveguide, wherein the semiconductor package includes: a rigid substrate; a waveguide material disposed within the rigid substrate; and a chiplet coupled with the rigid substrate, wherein the chiplet is to cause a radio frequency (RF) signal to propagate throughout the waveguide material within the rigid substrate.

Example 9 includes the semiconductor package of example 8, wherein the RF signal has a frequency of at least one terahertz (THz).

Example 10 includes the semiconductor package of example 8, further comprising a package substrate that is coupled with the rigid substrate by one or more physical interconnects.

Example 11 includes the semiconductor package of example 8, wherein the rigid substrate is a package substrate.

Example 12 includes the semiconductor package of any of examples 8-11, wherein the waveguide material includes a material with a loss tangent of less than $2\times10^4$.

Example 13 includes the semiconductor package of example 12, wherein the material has a loss tangent of less than $0.5\times10^{-4}$.

Example 14 includes the semiconductor package of any of examples 8-11, wherein the chiplet is electrically coupled with the waveguide material by a wave launcher that is to convert an electrical signal provided by the chiplet to the electromagnetic wave signal.

Example 15 includes the semiconductor package of any of examples 8-11, further comprising a wave launcher coupled with the waveguide material, wherein the wave launcher is to optically couple with a module coupled with the semiconductor package.

Example 16 includes a computing device comprising: an on-chip dielectric waveguide that includes a substrate and a waveguide material disposed within the substrate; and a processor that includes a plurality of chiplets, respective ones of the chiplets physically and communicatively coupled with the on-chip dielectric waveguide; wherein a first chiplet of the plurality of chiplets is to communicate with a second chiplet of the plurality of chiplet by a radio frequency (RF) signal that propagates through the on-chip dielectric waveguide.

Example 17 includes the computing device of example 16, wherein the RF signal has a frequency of greater than 200 Gigahertz (GHz).

Example 18 includes the computing device of example 17, wherein the RF signal has a frequency of greater than one terahertz (THz).

Example 19 includes the computing device of any of examples 16-18, wherein the waveguide material includes polymer or silicon dioxide ($SiO_2$).

Example 20 includes the computing device of any of examples 16-18, further comprising: a first waveguide launcher that is electrically coupled with the first chiplet and electromagnetically coupled with the waveguide material, wherein the first waveguide launcher is to convert an electrical signal received from the first chiplet to the electromagnetic wave; and a second waveguide launcher that is electrically coupled with the second chiplet and electromagnetically coupled with the waveguide material, wherein the second waveguide launcher is to convert the electromagnetic wave to an electrical signal provided to the second chiplet.

Example 21 includes the computing device of any of examples 16-18, wherein the on-chip dielectric waveguide is physically coupled with a package substrate by one or more interconnects.

Example 22 includes the computing device of any of examples 16-18, wherein the chiplet is physically coupled with a package substrate by one or more interconnects.

Example 23 includes the computing device of any of examples 16-18, wherein the substrate is a package substrate that is coupled with a printed circuit board (PCB) of the computing device by one or more interconnects.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A dielectric waveguide comprising:
 a substrate having a top face, a bottom face opposite to the top face, and a side face oriented perpendicular to the top face and the bottom face;
 a chiplet coupled to the top face;
 a waveguide material within the substrate;
 a first waveguide launcher electromagnetically and physically coupled with the waveguide material, wherein the first waveguide launcher is exposed at the side face of the substrate; and
 a second waveguide launcher electromagnetically and physically coupled with the waveguide material, wherein the second waveguide launcher is exposed at the side face of the substrate, and the waveguide material is to permit electromagnetic waves to propagate from the first waveguide launcher to the second waveguide launcher.

2. The dielectric waveguide of claim 1, wherein the waveguide material includes polymer or silicon dioxide ($SiO_2$).

3. The dielectric waveguide of claim 1, wherein the substrate includes glass or silicon.

4. The dielectric waveguide of claim 1, wherein the waveguide material includes a material with a loss tangent of less than $2\times10^{-4}$.

5. A semiconductor package that includes a dielectric waveguide, wherein the semiconductor package includes:
 a rigid substrate;
 a waveguide material within the rigid substrate, wherein the waveguide material includes a material with a loss tangent of less than $2\times10^{-4}$, and the waveguide material includes polymer or silicon dioxide ($SiO_2$); and
 a chiplet coupled with the rigid substrate, wherein the chiplet is configured to cause a radio frequency (RF) signal to propagate throughout the waveguide material within the rigid substrate.

6. The semiconductor package of claim 5, wherein the semiconductor package includes a first waveguide launcher electromagnetically and physically coupled with the waveguide material.

7. The semiconductor package of claim 6, wherein the semiconductor package includes a second waveguide launcher electromagnetically and physically coupled with the waveguide material.

8. The semiconductor package of claim 5, further comprising a package substrate that is coupled with the rigid substrate by one or more physical interconnects.

9. The semiconductor package of claim 5, wherein the rigid substrate is a package substrate.

10. The semiconductor package of claim 5, wherein the RF signal has a frequency of at least one terahertz (THz).

11. The semiconductor package of claim 5, wherein the chiplet is electrically coupled with the waveguide material by a wave launcher that is configured to convert an electrical signal provided by the chiplet to the RF signal.

12. The semiconductor package of claim 5, further comprising a wave launcher coupled with the waveguide material.

13. A computing device comprising:
- an on-chip dielectric waveguide that includes a substrate and a waveguide material within the substrate, wherein the waveguide material includes a material with a loss tangent of less than $2\times10^{-4}$, and the waveguide material includes polymer or silicon dioxide ($SiO_2$); and
- a processor that includes a plurality of chiplets, wherein individual chiplets of the plurality of chiplets are physically and communicatively coupled with the on-chip dielectric waveguide;
- wherein a first chiplet of the plurality of chiplets is to communicate with a second chiplet of the plurality of chiplet by a radio frequency (RF) signal that propagates through the on-chip dielectric waveguide.

14. The computing device of claim 13, wherein the RF signal has a frequency of greater than 200 Gigahertz (GHz).

15. The computing device of claim 14, wherein the RF signal has a frequency of greater than one terahertz (THz).

16. The computing device of claim 13, wherein the substrate is a package substrate that is coupled with a printed circuit board (PCB) of the computing device by one or more interconnects.

17. The computing device of claim 13, further comprising:
- a first waveguide launcher that is electrically coupled with the first chiplet and electromagnetically coupled with the waveguide material, wherein the first waveguide launcher is configured to convert a first electrical signal received from the first chiplet to the RF signal; and
- a second waveguide launcher that is electrically coupled with the second chiplet and electromagnetically coupled with the waveguide material, wherein the second waveguide launcher is configured to convert the RF signal to a second electrical signal provided to the second chiplet.

18. The computing device of claim 13, wherein the on-chip dielectric waveguide is physically coupled with a package substrate by one or more interconnects.

19. The computing device of claim 13, wherein the first chiplet is physically coupled with a package substrate by one or more interconnects.

\* \* \* \* \*

UNITED STATES PATENT AND TRADEMARK OFFICE
CERTIFICATE OF CORRECTION

PATENT NO. : 10,992,017 B2  
APPLICATION NO. : 16/192293  
DATED : April 27, 2021  
INVENTOR(S) : Telesphor Kamgaing et al.

Page 1 of 1

It is certified that error appears in the above-identified patent and that said Letters Patent is hereby corrected as shown below:

On the Title Page

Item (54) and In the Specification, In Column 1, Line 5 of the TITLE, delete "NETWORKS" and insert -- NETWORK --, therefor.

Signed and Sealed this
Fifteenth Day of June, 2021

Drew Hirshfeld
*Performing the Functions and Duties of the
Under Secretary of Commerce for Intellectual Property and
Director of the United States Patent and Trademark Office*